(12) United States Patent
Ohnhaeuser et al.

(10) Patent No.: US 7,944,387 B2
(45) Date of Patent: May 17, 2011

(54) ADC WITH LOW-POWER SAMPLING

(75) Inventors: Frank Ohnhaeuser, Stein (DE);
Andreas Wickmann, Nuremberg (DE)

(73) Assignee: Texas InstrumentsDeutschland GmbH, Freising (DE)

( * ) Notice: Subject to any disclaimer, the term of this patent is extended or adjusted under 35 U.S.C. 154(b) by 0 days.

(21) Appl. No.: 12/687,703

(22) Filed: Jan. 14, 2010

(65) Prior Publication Data

US 2010/0194619 A1    Aug. 5, 2010

(30) Foreign Application Priority Data

Jan. 14, 2009  (DE) ............ 10 2009 004 564

(51) Int. Cl.
*H03M 1/12* (2006.01)
(52) U.S. Cl. .......................... 341/172; 341/155
(58) Field of Classification Search .......... 341/155–172
See application file for complete search history.

(56) References Cited

U.S. PATENT DOCUMENTS

| | | | |
|---|---|---|---|
| 6,340,942 B1 * | 1/2002 | Zhou et al. | 341/158 |
| 6,456,220 B1 * | 9/2002 | Leung et al. | 341/155 |
| 6,707,403 B1 * | 3/2004 | Hurrell | 341/120 |
| 6,720,903 B2 * | 4/2004 | Confalonieri et al. | 341/172 |
| 6,891,495 B2 * | 5/2005 | Chen et al. | 341/161 |
| 6,940,445 B2 | 9/2005 | Kearney | |
| 7,015,841 B2 | 3/2006 | Yoshida et al. | |
| 7,023,372 B1 * | 4/2006 | Singh et al. | 341/155 |
| 7,136,006 B2 * | 11/2006 | Koh et al. | 341/172 |
| 7,167,121 B2 * | 1/2007 | Carreau et al. | 341/150 |
| 7,271,758 B2 | 9/2007 | Piasecki et al. | |
| 7,773,024 B2 * | 8/2010 | Ohnhauser et al. | 341/172 |
| 2009/0027251 A1 * | 1/2009 | Ohnhauser et al. | 341/158 |
| 2009/0073018 A1 * | 3/2009 | Mitikiri | 341/156 |
| 2010/0026546 A1 * | 2/2010 | Ohnhaeuser et al. | 341/172 |

FOREIGN PATENT DOCUMENTS

DE        102007033689        1/2009

* cited by examiner

*Primary Examiner* — Lam T Mai
(74) *Attorney, Agent, or Firm* — John J. Patti; Wade J. Brady, III; Frederick J. Telecky, Jr.

(57) ABSTRACT

An apparatus for analog-to-digital conversion using successive approximation is provided, which is adapted to be supplied with a single ended supply voltage. The device includes: a first analog-to-digital conversion stage including a first set of capacitors coupled with a side at a common node and adapted to sample an input voltage and to be coupled to either a first reference voltage level or a second reference voltage level, at least one capacitor of the first set of capacitors being adapted to be left floating, a control stage being adapted to connect the at least one floating capacitor to the first reference voltage level or the second reference voltage level in response to an analog-to-digital conversion decision made by a second analog-to-digital conversion stage. The first analog-to-digital conversion stage is operable to couple the common node to a supply voltage level, in particular ground, during analog-to-digital conversion.

5 Claims, 11 Drawing Sheets

US 7,944,387 B2

ADC WITH LOW-POWER SAMPLING

CROSS-REFERENCE TO RELATED APPLICATIONS

This application is claims priority from German Patent Application No. 10 2009 004 564.3, filed Jan. 14, 2009, which is hereby incorporated by reference for all purposes.

TECHNICAL FIELD

The present invention relates to an apparatus and a method for analog-to-digital conversion using successive approximation.

BACKGROUND

Successive approximation is one of the basic principles for analog-to-digital conversion. The general functionality and operation of successive approximation register (SAR) analog-to-digital converters (ADCs) is well known in the art. SAR ADCs compare the analog input voltage to reference voltage levels, which can be generated by a digital-to-analog converter (DAC). During a first clock cycle, the sampled input voltage may be compared to half the reference voltage output by the DAC. If the result of the comparison indicates that the input voltage is greater than half the reference voltage, then a respective bit decision relating to the most significant bit (MSB) is made. During the next clock cycle, the input voltage is compared to three quarters or one quarter of the reference voltage in accordance with the preceding MSB decision, and a further bit decision is made relating to the next less significant bit (MSB-1). The conversion procedure carries on accordingly, and the DAC output voltage converges successively to the analog input voltage, while evaluating one bit during each clock cycle. The SAR ADC is arranged such that, when the conversion is completed, the digital number input to the DAC represents the digitized input voltage.

Since precise DAC voltages are used, capacitive DACs (CDACs) are often used, which include a plurality of capacitors. Such a known analog-to-digital converter stage having a CDAC is shown in FIG. 1. The CDAC has a positive side with sampling capacitors $C1p$-$CNp$ and a negative side with capacitors $C1n$-$CNn$. The capacitors $C1p$ and $C1n$ are adapted to evaluate the most significant bit (MSB) and the capacitors $CNp$ and $CNn$ are adapted to evaluate the least significant bit (LSB). The common nodes VCPOS and VCNEG of each of the capacitors $C1p$-$CNp$ and $C1n$-$CNn$ can be coupled to a common mode voltage VCM by sample and hold switches SWHp, SWHn. The other side of each of the capacitors $C1p$-$CNp$ and $C1n$-$CNn$ can be coupled to a positive reference voltage +REF, a negative reference voltage −REF or a symmetric input voltage INp, INn.

The analog input voltage can be sampled directly on the capacitors $C1p$-$CNp$ and $C1n$-$CNn$ by closing (switches are conducting) the switches SWHn, SWHp and coupling INp and INn to the other side of some or all capacitors, such that a charge corresponding to the size of the capacitors and proportional to the amplitude of the input voltage is present on the sampling capacitors. The sampled charge is redistributed stepwise among the capacitors of the CDAC. The magnitude of the input voltage is basically determined by selectively and consecutively switching the other sides of the capacitors between the different reference voltage levels +REF and −REF and comparing the established voltage level on the common nodes VCPOS, VCNEG. The switching of the other side of each of the plurality of capacitors is performed through numerous switches $S1n$-$SNn$, $S1p$-$SNp$, which are controlled by control signals CDACCNTL provided by control stage SAR-CNTL in response to the comparator output COMPOUT at each step of the conversion process. The capacitors having the largest capacitance $C1p$, $C1n$ can be the first to be connected to a specific reference voltage level, while the remaining capacitors $C2p$-$CNp$, $C2n$-$CNn$ are connected to another reference voltage level. Then the voltage on the common nodes VCPOS, VCNEG, which are connected to respective positive and negative inputs of a comparator CMP, is compared, and the output ADCOUT of the comparator CMP represents the bit values of the digital output word DOUT bit by bit, starting with the most significant bit (MSB). In accordance with the signal at the output ADCOUT of the comparator CMP (i.e. the comparison result), the capacitors $C1p$-$CNp$ and $C1n$-$CNn$ are consecutively connected one-by-one to either the first or the second reference voltage level +REF or −REF and remain in the position during the subsequent conversion steps. The intermediate results are stored in a register (successive approximation register) which resides together with other logic for controlling the analog-to-digital conversion process in a control stage referred to as successive approximation register control stage SAR-CNTL. The control stage SAR-CNTL may have an input for receiving a clock signal CLK and an input for receiving a start signal START which indicates that conversion is to be started. The control stage SAR-CNTL provides the digital output word which represents the digital value of the sampled input voltage at output node DOUT.

Up-to-date apparatuses, and corresponding semiconductor manufacturing processes, typically use supply voltages of 5 V or less in order to save power and to gain speed. The supply voltage limits the input signal range of the ADCs. In order to convert a +/−10 V input signal, which is a typical industrial standard, the signal is divided either with a resistive divider or with a capacitive divider, so as to fit the input signal voltage range into the comparator's input voltage range, which can basically be between ground and the supply voltage level. However, the division of the input signal decreases the signal-to-noise ratio (SNR) of the ADC. With a 5 V supply voltage range and an input range of, for example, +/−10 V (i.e. a division by 4 is used for an input range of +/−10 V), the least significant bit (LSB) of a 16 bit converter corresponds to 76 μV, although it could amount to 305 μV if the signal was not divided. The input range could also be +/−5 V or +/−12 V, etc., for example. A typical up-to-date 16 bit SAR converter has a noise level that corresponds to 2 to 6 LSB at the output for any DC input voltage. In order to handle the relatively large input voltage range, high-voltage transistors are used. Typical 5 V semiconductor manufacturing processes provide high-voltage transistors so that ADCs are available that have a high input voltage range even on a low voltage core that runs, for example, with the 5 V supply voltage. However, dividing the input signal is used, thereby decreasing the achievable SNR.

Furthermore, the analog cores of conventional analog-to-digital converters usually operate with single ended low voltage supply. The maximum voltage swing of high impedance nodes VCNEG, VCPOS inside the SAR ADC which are based on charge redistribution principal is limited by the maximum supply voltage range. The hold switches SWHp, SWHn that serve to store charge on the capacitors usually include NMOS and PMOS transistors, typically in form of transmission gates. The bulk of the NMOS transistors are usually connected to the lowest potential which is ground for single ended supplies. The bulk of PMOS transistors are typically connected to the supply voltage level. If the high impedance nodes (common nodes VCNEG, VCPOS) leave the admissible voltage range, the bulk diodes can be forward biased. The loss of charge on the high impedance nodes may decrease the performance dramatically. To avoid a leakage through parasitic diodes, a common mode voltage VCM is used. With single ended power supplies the common mode voltage level VCM is somewhere between ground and supply voltage level (i.e. higher than ground). Furthermore, in order to ensure good performance (i.e. for example good total harmonic distortion THD) a fast voltage buffer BU is used. However, this buffer BU continuously consumes power during the sampling phase. If very short acquisition time is used, the total power consumption of active components (in particular the power consumption of buffer BU) may be substantially increased.

SUMMARY

An apparatus is provided for analog-to-digital conversion using successive approximation. The device comprises a first analog-to-digital conversion stage with a first set of capacitors. One side of at least one capacitor of the first set of capacitors is adapted to be left floating after sampling an input voltage on the first set of capacitors. However, more than one of the capacitors could also be left floating. A plurality of switches is provided for connecting a side of each capacitor of the plurality of capacitors to a first reference voltage level or a second reference voltage level. A control stage is coupled to connect the at least one capacitor that is left floating to the first reference voltage level or the second reference voltage level in response to a conversion step performed by a second analog-to-digital conversion stage. The first set of capacitors is coupled with a side at a common node. Furthermore, the first analog-to-digital conversion stage is operable to couple the common node to a supply voltage level (ground is considered as an advantageous supply voltage level for an aspect of the invention) during analog-to-digital conversion. The floating state of a capacitor may also be achieved by (and may practically mean) coupling the capacitor through a very high ohmic resistance as long as the charge is sufficiently preserved on the capacitor.

According to an aspect of the invention, a high input voltage can be sampled on the first set of capacitors (i.e. on a capacitive array, which may be a capacitive digital to analog conversion stage of a SAR ADC) without having to divide the input voltage before performing the conversion. The first set of capacitors is connected with one side to a common node through which charge is redistributed during conversion. The voltage on the common node converges during the successive approximation procedure and should not exceed the comparator input range. In order to handle input voltage levels higher than the maximum input voltage range of the comparator, the first conversion step (or steps) is performed by another ADC, i.e. the second analog-to-digital conversion stage. The second analog-to-digital conversion stage may be any kind of ADC and it may advantageously have a lower overall performance than the first analog-to-digital conversion stage (i.e. it may have lower signal to noise ratio, resolution etc.). Therefore, the second analog-to-digital conversion step may use less chip area or calibration. The second analog-to-digital conversion stage may advantageously be used for bit decisions relating to the floating capacitor(s) of the first analog-to-digital conversion stage. The floating capacitor(s) in the first analog-to-digital conversion stage is (are) coupled to reference voltage levels (ground is also considered as a reference voltage level) in accordance with the decision made by the second analog-to-digital conversion stage. The floating capacitor(s) and the first set of capacitors are dimensioned such that convergence of the successive approximation procedure is ensured when the floating capacitor(s) is (are) connected to the respective reference level. Since the full electrical charge of the input voltage is sampled with the first analog-to-digital conversion stage and since the entire sample charge remains on the capacitors during conversion, there is no loss of SNR compared with ADCs which divide the input voltage before conversion. Moreover, since the bit decisions relating to the floating capacitors of the first analog-to-digital conversion stage are made by a second analog-to-digital conversion stage, it is possible to use a supply voltage level (e.g. ground) of a single ended supply voltage as the common mode voltage level of the apparatus, in particular as the common mode voltage level for a comparator used for performing the bit decisions. The advantage of using the supply voltage, as for example a ground level, as the common mode voltage level for the analog-to-digital conversion stage resides in a reduced power consumption as no additional common mode voltage level is generated and applied. In particular, there is no need for buffering the common mode voltage level if a supply voltage level (e.g. ground level) can be used. Furthermore, supply voltage, in particular ground, is typically available all over an integrated circuit in a very low ohmic manner.

The control stage may be adapted to perform a number of analog-to-digital conversion decisions with the second stage and to connect floating capacitors of the first stage in response to the decision such that after connecting the floating capacitors to the first or second reference voltage level, a voltage level at the common node with respect to the supply voltage level (e.g. ground) is lower than a forward bias voltage of a diode. The diode may be a parasitic diode of a MOSFET used as a sample and hold switch in the analog-to-digital conversion stage.

The second analog-to-digital conversion stage may also be adapted to use successive approximation and it may comprise a second set of capacitors. Furthermore, the second analog-to-digital conversion stage may be operable to divide the input voltage before it is converted.

The second analog-to-digital conversion stage may continue analog-to-digital conversion (i.e. it may determine where to couple further capacitors), while the floating capacitor(s) of the first analog-to-digital converter is/are coupled to the respective reference voltage. This helps to speed up conversion speed and may be useful to extend the amount of time for connecting the floating capacitors. The floating capacitors may then be coupled very slowly and smoothly to the respective reference voltage level, which reduces the risk of spikes.

There may be a comparator coupled to the common node of the first set of capacitors. The common mode input voltage level of the comparator may be shifted from the supply voltage level (e.g. ground) to another (e.g. higher) voltage level while at least one of the floating capacitors is still floating. This means that shifting the common mode input voltage level of the comparator is performed not longer than until all the floating capacitors are connected. Shifting the common mode input voltage level prevents glitches (voltage spikes) on the common node from forward biasing (opening) parasitic diodes of switches including MOSFETs.

A first analog-to-digital conversion stage with a first set of capacitors can be used, which may include a first set of capacitors and a second set of capacitors. A first side of each of the first set of capacitors may be coupleable or coupled to a common node and a second side of at least one of the capacitors may firstly be connected to an input voltage and then left floating during evaluation of the more significant bits (for example at least the first two bits) of the input voltage. This capacitor is known as a "floating" capacitor and it means that the charge (the input voltage) on the capacitor is frozen during evaluation of the more significant bits. However, more than one floating capacitor may be used. The second analog-to-digital conversion stage evaluates the value of these more significant bits of the input voltage while the capacitor in the first set of capacitors is left floating. According to the results of the evaluation, the "floating" side of the floating capacitor is then connected to either a first or second reference voltage level. If the input to the control stage (e.g. a comparator) changes, the respective bit in the register corresponding to the reference voltage level to which the capacitor should be connected changes in the next step of analog-to-digital conversion, so that the analog-to-digital conversion converges. For example, if the input voltage evaluated by the analog-to-digital conversion stage is greater than a voltage level to which it is compared, the floating side of the capacitor may be connected to a negative reference voltage level, which pulls down the input voltage stored on the capacitor. If the bit value is evaluated to be less than the voltage level to which it is compared, the floating side of the capacitor may be connected to a positive voltage level, which pulls up the input voltage stored on the capacitor. The remainder of the analog-to-digital conversion is then run on the plurality of capacitors for the whole sampled charge. This means that the voltage remains within the allowed range when applied to the input nodes of a comparator, without the dividing the input voltage. Therefore, the device in accordance with a preferred embodiment of the present invention has an improved SNR compared to prior art devices.

In other words, a specific amount of sample charge, which is frozen on the floating capacitors, is not used during the first bit (MSB) decision steps, where high voltages can occur at the comparator input. However, as the charge is frozen, it can be used later during the conversion process, even though it did not contribute to the conversion process during the first step or during several of the first steps. These are the values of the most significant bits of the corresponding digital output word. After the first bit decisions are made by the second analog-to-digital conversion stage, the floating capacitor or capacitors in the plurality of capacitors can be connected correctly to a specific reference voltage in accordance with the bit values of the first decisions. Once the first most significant bit decision or decisions are made, the conversion procedure continues with the plurality of capacitors according to known successive approximation principles. However, as the floating capacitors hold additional charge, which is activated during later decision steps, the loss in SNR due to dividing can be made small and even equal to zero. Accordingly, the floating capacitor (or even a plurality of floating capacitors) preferably represents a major part of the capacitance of the plurality of capacitors. Once the more significant bit decisions are made, the comparator input, i.e., the voltage at the common node, converges to an internal operating point, which is within the allowed voltage range and the complete charge can be activated. This means that the frozen charge can be released so that the signal amplitude is nearly +/−10 V again, but the internal nodes can not leave the allowed voltage range. The loss in terms of SNR is thereby substantially reduced compared with a conventional ADC.

The advantage of a small error is provided and any error that does arise may be corrected with a simple error correction scheme. Furthermore, the capacitors of the first analog-to-digital conversion stage constitute a small load on the reference input since the MSB capacitors (i.e. advantageously the floating capacitors) switch a small number of times between the negative reference and the positive reference and the switching may not cause significant spikes or glitches at the comparator input. However, even switching can be prevented according to aspects of the invention by increasing the common mode voltage level at the comparator input.

In a preferred embodiment, the at least one capacitor that can be left floating may be adapted to represent one of the most significant bits. The most significant bit decision (as to whether to connect the floating capacitor to the first or the second reference voltage) can thus be made by the second analog-to-digital conversion stage and the larger capacitors of the first set of capacitors have to switch once, when the MSBs are evaluated by the second analog-to-digital conversion stage.

In an advantageous embodiment, the control stage may be adapted to perform a dynamic error correction procedure. This provides a reliable error correction, which can be carried out for some bit decisions or after each bit decision. The error correction may be necessary to ensure convergence of the analog-to-digital conversion procedure in the first analog-to-digital conversion stage since at least one of the MSB decisions is performed by the second analog-to-digital conversion stage, which may have lower performance than the first analog-to-digital conversion stage. However, the error correction scheme provides sufficient safety to ensure convergence, even with an additional low performance second analog-to-digital conversion stage.

The second analog-to-digital conversion stage may be adapted to use successive approximation. Furthermore, the second analog-to-digital conversion stage may comprise a second set of capacitors. In an advantageous aspect of the invention, the second analog-to-digital conversion stage may be operable to divide the input voltage before it is converted. If the second analog-to-digital conversion stage divides the input signal, there is no loss in performance with respect to the first analog-to-digital conversion stage. If the first and the second analog-to-digital conversion stages are implemented in a similar manner with capacitive arrays, they may even share the same comparator. Therefore, a comparator may be provided having inputs coupled to the first set of capacitors and the second set of capacitors for making alternately bit decisions with respect to the first set of capacitors and the second set of capacitors.

A method is also provided using successive approximation. An input voltage can be sampled on the first set of capacitors which are coupled with the first side to common node which is connected to a supply voltage level (e.g. ground). A second side of at least one capacitor of the first set of capacitors can be left floating after the step of sampling. At least one analog-to-digital conversion step may be performed with a second analog-to-digital conversion stage and the at least one floating capacitor can be connected to a first reference voltage level or a second reference voltage level in accordance with the analog-to-digital conversion step of the second analog-to-digital conversion stage. This means that the SNR of the first analog-to-digital conversion stage can be as high as if no input signal division was used. The first set of capacitors is switching once. In order to prevent glitches when switching the floating capacitors to the first or second reference voltage levels, the common mode voltage level of a comparator used to make bit decisions and coupled to the common node may be shifted for a limited duration while at least one of the floating capacitors is still floating. The input signal may be divided in the second analog-to-digital conversion stage before performing the analog-to-digital conversion step with the second analog-to-digital conversion stage relating to the floating capacitor of the first analog-to-digital conversion stage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF EMBODIMENTS

Figure 1:
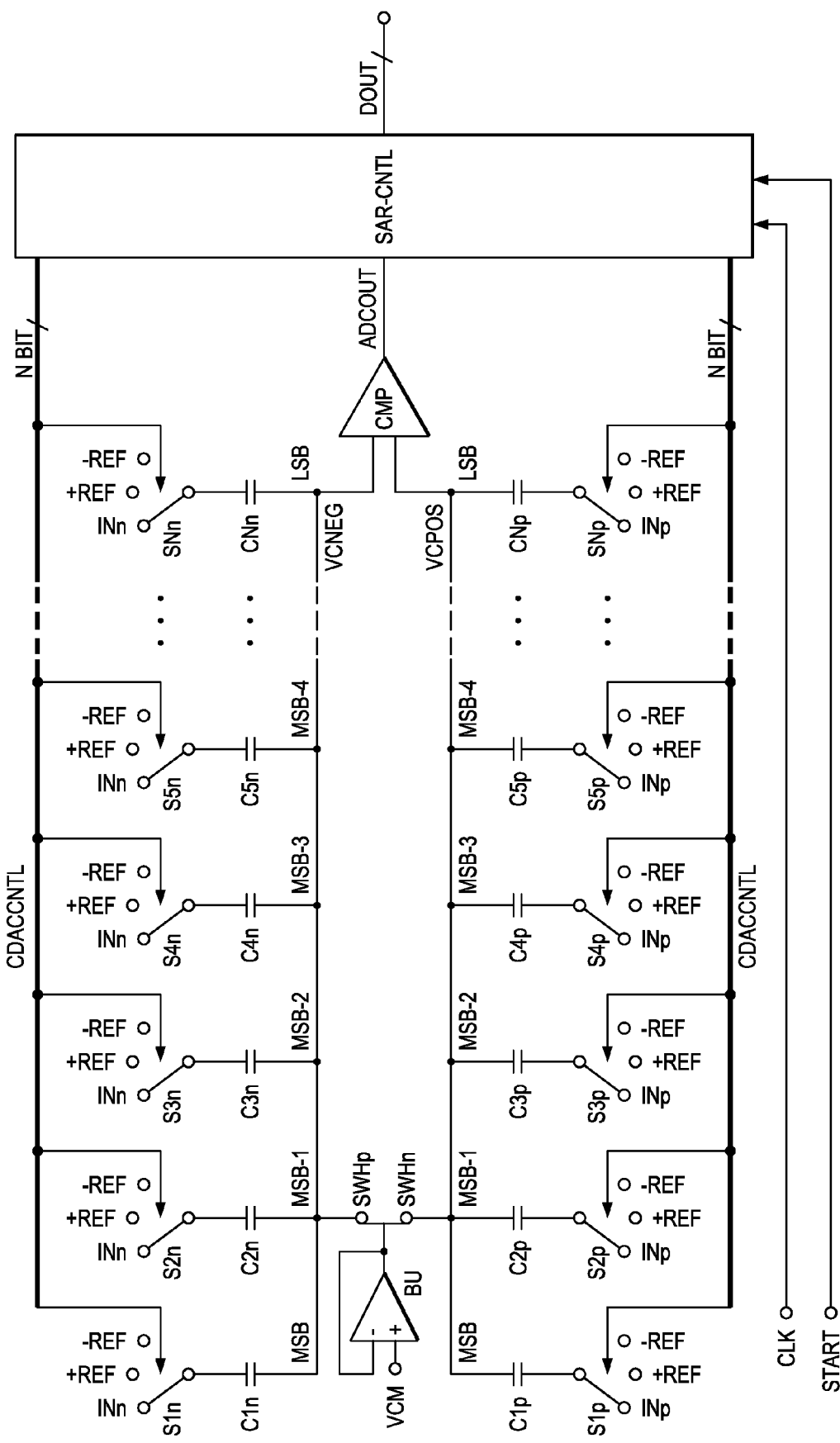
FIG. 1 is a simplified circuit diagram of a prior art analog-to-digital conversion stage.

Refer now to the drawings wherein depicted elements are, for the sake of clarity, not necessarily shown to scale and wherein like or similar elements are designated by the same reference numeral through the several views.

Figure 2:
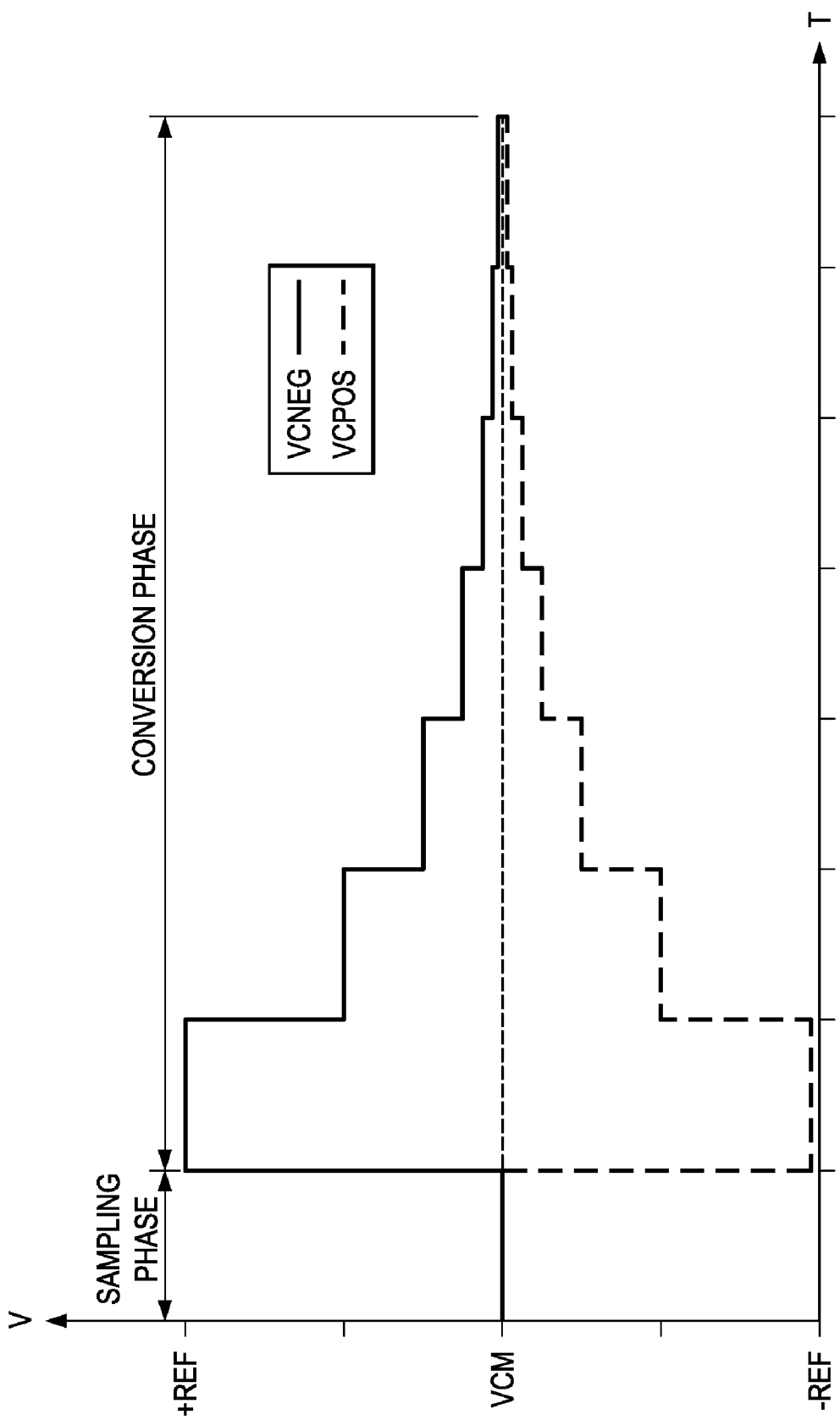
FIG. 2 is a diagram showing waveforms of voltage levels of the prior art analog-to-digital conversion stage of FIG. 1.

FIG. 2 shows a diagram of waveforms relating to the internal high impedance common nodes VCNEG and VCPOS shown in FIG. 1. The behavior of VCPOS and VCNEG is shown during the sampling phase and the conversion phase for +IN=+REF, −IN=−REF and VCM=(+REF−−REF)/2 in case of a unipolar input voltage the negative reference −REF is equal to 0V. The maximum allowed swing of VCPOS and VCNEG is limited by the properties of hold switches SWHp and SWHn. The hold switches SWHp and SWHn include a NMOS and PMOS transistors. The bulk of an NMOS transistor is then connected to the lowest potential (e.g. a supply voltage level as ground for single ended supply voltages). The bulk of a PMOS transistor is connected to a positive supply voltage level. However, if the voltage levels on the high impedance common nodes VCPOS and VCNEG leave the supply voltage range (i.e. they are lower than ground or higher than supply voltage level), the bulk diodes (parasitic diodes) can be forward biased. This may cause a significant loss of charge which is stored on the high impedance nodes VCPOS and VCNEG. In order to avoid this leakage, a common mode voltage VCM is used and typically used. With a single ended power supply, the common mode voltage VCM is generally above ground. To ensure a good total harmonic distortion performance, fast voltage buffers for buffering the common mode voltage are used. These buffers consume a substantial amount of power. As shown in FIG. 2, the largest overdrive on common nodes VCPOS and VCNEG occurs during the first bit decisions, which are made after the sampling phase. For a 5 V supply voltage and if common mode voltage VCM is too low (e.g. 0 V) the maximum overdrive during conversion can easily forward bias the parasitic diodes.

Figure 3:
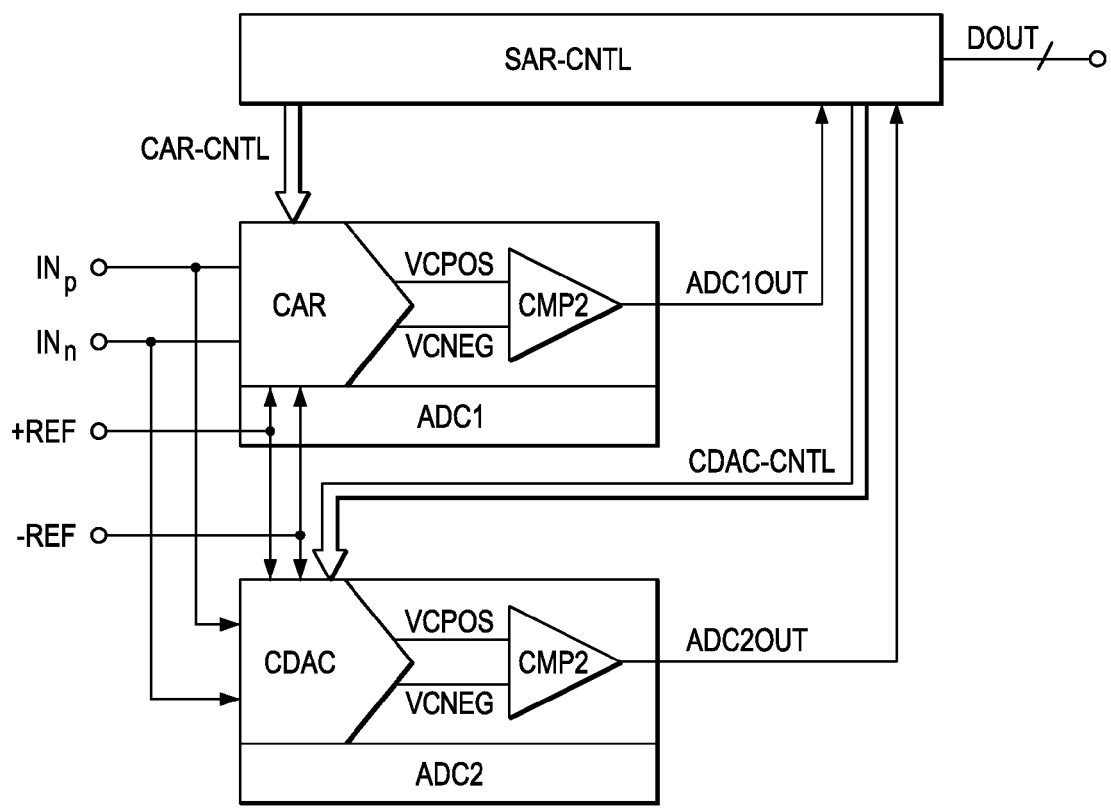
FIG. 3 is a simplified block diagram of an apparatus according a preferred embodiment of the present invention.

FIG. 3 shows a simplified block diagram of a device for analog-to-digital conversion using successive approximation according to a preferred embodiment of the present invention. A first analog-to-digital conversion stage ADC1 may include a capacitive array CAR for evaluating bits of an analog-to-digital conversion. The first capacitive array CAR may be coupled to a first comparator CMP1. The first comparator CMP1 outputs a signal ADC1OUT to a successive approximation register control stage SAR-CNTL. Signal ADC1OUT may indicate the comparison result of CMP1. A second analog-to-digital conversion stage ADC2 can also be coupled to the successive approximation register control stage SAR-CNTL. The successive approximation register control stage SAR-CNTL may include a successive approximation register.

The second analog-to-digital conversion stage ADC2 may be any kind of analog-to-digital converter. However, the second analog-to-digital conversion stage may preferably be implemented similarly to the first analog-to-digital conversion stage, which includes the first capacitive array CAR. The second analog-to-digital conversion stage ADC2 may then include a capacitive digital to analog converter CDAC (i.e. another capacitive array) and a second comparator CMP2. The second analog-to-digital conversion stage ADC2 provides a second output signal ADC2OUT to control stage SAR-CNTL. In the present embodiment, signal ADC2OUT is the comparison result of CMP2. The capacitive arrays CAR and CDAC receive positive input signal +IN and a negative input signal −IN, which are the two instances of a symmetric input signal. CAR and CDAC also receive positive and negative reference voltage levels +REF and −REF. Control signals CARCNTL and CDACCNTL are provided by control stage SAR-CNTL in order to control the first analog-to-digital conversion stage, in particular switches (not shown) in the first capacitive array CAR and in the second analog-to-digital conversion stage ADC2.

The capacitive array CAR and the CDAC are arranged such that at least a partial or intermediate analog-to-digital conversion result (which is produced in one or more steps of the analog-to-digital conversion procedure) from the CDAC can be transferred via signal ADC2OUT to the control stage SAR-CNTL and via control signal CAR-CNTL to the first analog-to-digital conversion stage, in particular to capacitive array CAR. The second comparator CMP2 forms part of the second analog digital conversion stage ADC2. The output of comparator CMP2 provides an intermediate result of its own conversion procedure and this intermediate result is used by control stage SAR-CNTL for issuing signals CAR-CNTL for connecting one side of one of the capacitors in the first capacitive array CAR that is left floating to the positive reference voltage level +REF or the negative voltage reference level −REF.

The input voltage on +IN and −IN is sampled using both the capacitive array CAR of ADC1 and CDAC of the analog-to-digital conversion stage ADC2. One or more capacitors used for sampling of the capacitive array CAR, which may have higher resolution than the second stage CDAC of ADC2 are floating for the first cycles. The respective charge at common nodes VCPOS, VCNEG of the first comparator CMP1 is frozen. The analog-to-digital conversion stage ADC2 may divide the input voltage and evaluates the value of the first bits (in this example at least the first two MSBs). According to the results of this evaluation, the capacitors in the capacitive array CAR of ADC1 which have been left floating during the first step or steps can be connected to either the positive reference voltage +REF or the negative reference voltage −REF. When all floating capacitors are connected, the remainder of the conversion may run on the capacitive array CAR with the entire sampled charge according to a normal successive approximation procedure.

The errors resulting from offset, increased noise, a difference in gain, mismatch of the analog-to-digital conversion stages may be eliminated with dynamic error correction. The position of this error correction in the timing scheme of the analog-to-digital converter may depend on the expected size of the error after some conversion steps. However, at least one error correction step should be performed when the last floating capacitor in CAR is connected to a reference voltage in response to a conversion performed by the second analog-to-digital conversion stage ADC2. As the requirements on resolution, signal to noise ratio etc. on the second analog-to-digital conversion stage ADC2 are lower than on the first analog-to-digital conversion stage ADC1 (which includes the floating capacitors), the may be adapted to divide the input voltage.

The error produced after each evaluation step is very small and it is possible to achieve, for example, a ten-bit or more accuracy. As described below, any error that arises can be eliminated with dynamic error correction after having connected the floating capacitors. This renders synchronization easier, since no large capacitors switch between the reference voltage levels. The second analog-to-digital conversion stage ADC2 may continue analog-to-digital conversion (i.e. it may determine where to couple further capacitors), while the floating capacitor(s) of the first analog-to-digital converter is/are coupled to the respective reference voltage. This can help to speed up conversion and may be useful to extend the amount of time for connecting the floating capacitors in ADC1. The floating capacitors in ADC1 may advantageously be coupled very slowly and smoothly to the respective reference voltage level. This reduces the risk of spikes. Although the embodiment shown in FIG. 3 is symmetric, it is also possible to use single-ended architectures.

Figure 4:
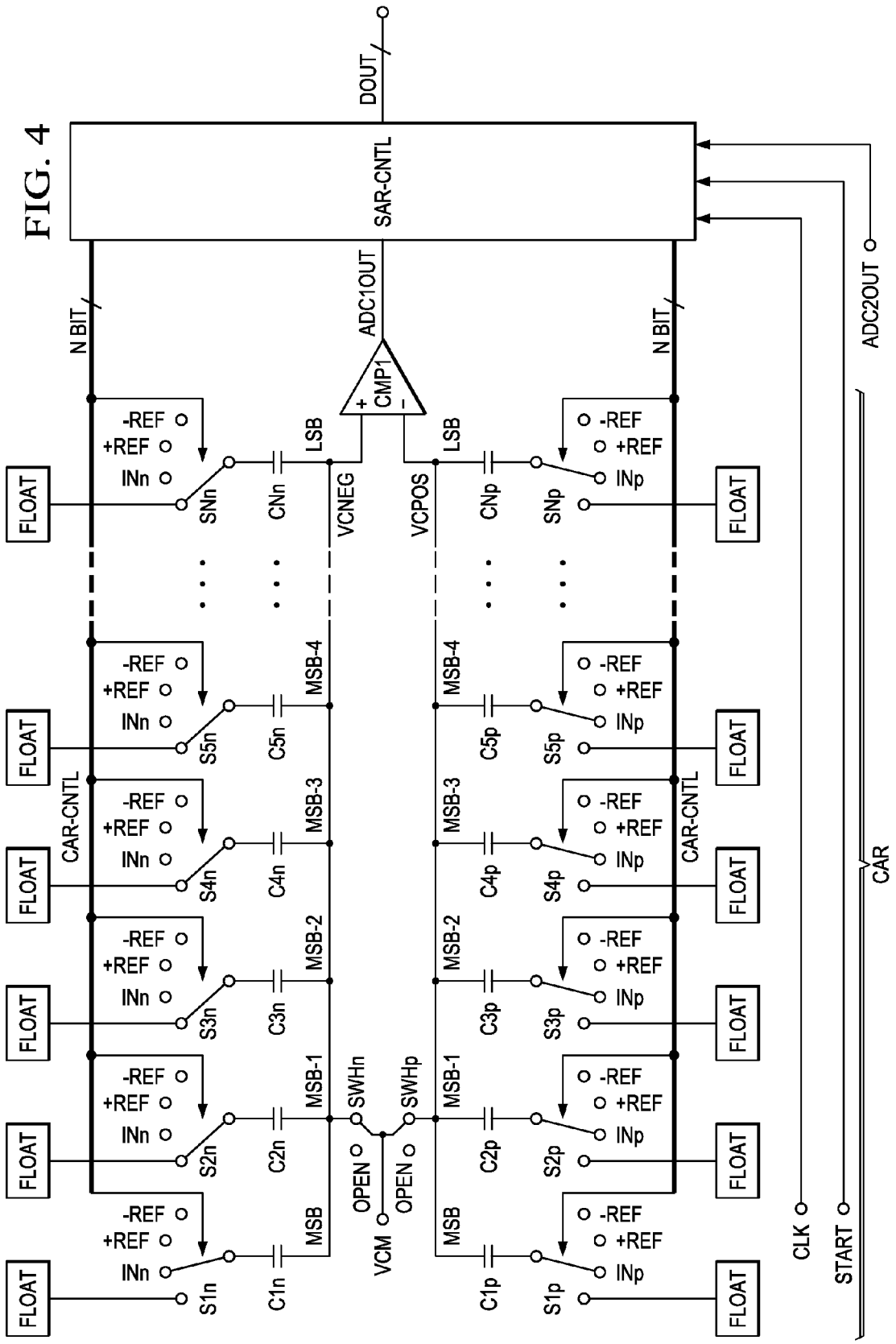
FIG. 4 is a simplified circuit diagram of a first analog-to-digital conversion stage in an apparatus according to a preferred embodiment of the present invention.

FIG. 4 shows a simplified circuit diagram of a first analog-to-digital conversion stage ADC1 according to a preferred embodiment of the present invention. The first analog-to-digital conversion stage ADC1 may include a capacitive digital-to-analog conversion stage which can be used as first set of capacitors or capacitive array CAR of FIG. 3. There is also a first comparator CMP1. The capacitive array CAR shown in FIG. 4 is a symmetric or fully differential architecture, but it may also be implemented in an asymmetric or single ended architecture. CAR has a positive side with sampling capacitors C1p-CNp and a negative side with capacitors C1n-CNn. The suffix "p" designates that the capacitors are coupled to the positive common node VCPOS and the suffix "n" designates that the capacitors are coupled to the negative common node VCNEG. The capacitors C1p and C1n are adapted to evaluate the most significant bit (MSB) and the capacitors CNp and CNn are adapted to evaluate the least significant bit (LSB). The capacitance values of capacitors C1p-CNp and C1n-CNn may be binary weighted. One side of each of the capacitors C1p-CNp and C1n-CNn can be coupled to a common mode voltage VCM by sample and hold switches SWHp, SWHn. In order to save the charge on common nodes VCNEG and VCPOS the sample and hold switches SWHp and SWHn can be switched in an open stage indicated with connections OPEN. The other side of each of the capacitors C1p-CNp and C1n-CNn can be coupled through switches S1n-SNn, S1p-SNp to a positive reference voltage +REF, a negative reference voltage −REF or an input voltage INp on the positive side and INn on the negative side. In the embodiment shown in FIG. 4, each of the capacitors C1p-CNp, C1n-CNn of the plurality of the capacitors can also be left floating. This option is indicated by an additional switch position FLOAT of switches S1n-SNn, S1p-SNp. If a switch resumes this position the respective side of the capacitors remains floating.

As previously described with respect to FIG. 1, also for the embodiment of FIG. 4, an analog input voltage can be sampled directly on the capacitors C1p-CNp and C1n-CNn by opening hold switches SWHn, SWHp after sampling, such that a charge corresponding to the size of the capacitors and proportional to the amplitude of the input voltage remains present on the capacitors used for sampling. However, in the next step some of the switches S1n-SNn, S1p-SNp may be turned to FLOAT (i.e. after the sampling step), i.e. that the charge on the floating capacitors may not contribute in the first steps of the conversion procedure.

The control stage SAR-CNTL may generally work as described with respect to the corresponding stage shown in FIG. 1. However, in a preferred embodiment of the present invention, control stage SAR-CNTL receives an additional input signal ADC2OUT from a second analog-to-digital conversion stage ADC2 (as shown in FIG. 3). Based on the information received from the second analog-to-digital conversion stage, the floating capacitors are connected to either REF or +REF. The second analog-to-digital conversion stage ADC2 performs one or more conversion steps. It may work separately and independently from the circuitry shown in FIG. 4. These conversion steps are advantageously one or more of the first conversion steps, during which the MSBs of the digital output word are determined. The corresponding information, which is determined in the second analog-to-digital conversion stage (ADC2 in FIG. 3), is passed with signal ADC2OUT to control stage SAR-CNTL. By control signals CARCNTL the floating capacitors, i.e. the capacitors the setting of which is determined in the second analog-to-digital conversion stage, are connected to either +REF or −REF.

By switching the floating capacitors during the first steps to the correct reference voltage level and the remaining capacitors in subsequent steps, which are performed according to the normal successive approximation procedure based on the comparator output ADC1OUT, the sampled charge is redistributed stepwise among the capacitors of the capacitive array CAR. Since the floating capacitors are directly connected to the reference voltage level −REF or +REF, the voltage level on the common nodes VCNEG and VCPOS is kept small. When the floating capacitors are connected in the first analog-to-digital conversion stage ADC1, the whole sampled charge can contribute during the charge redistribution and provides that the signal to noise ratio of the first analog-to-digital conversion stage ADC1 according to the embodiment shown in FIG. 4 is the same as that of a SAR-ADC having much greater power supply voltage range, or input voltage range of comparator CMP1. Performance of ADC1 may be improved if connecting the floating capacitor(s) is performed very smoothly and slowly. ADC2 may then continue with analog-to-digital conversion to give ADC1 more time for connecting floating capacitors.

Figure 5:
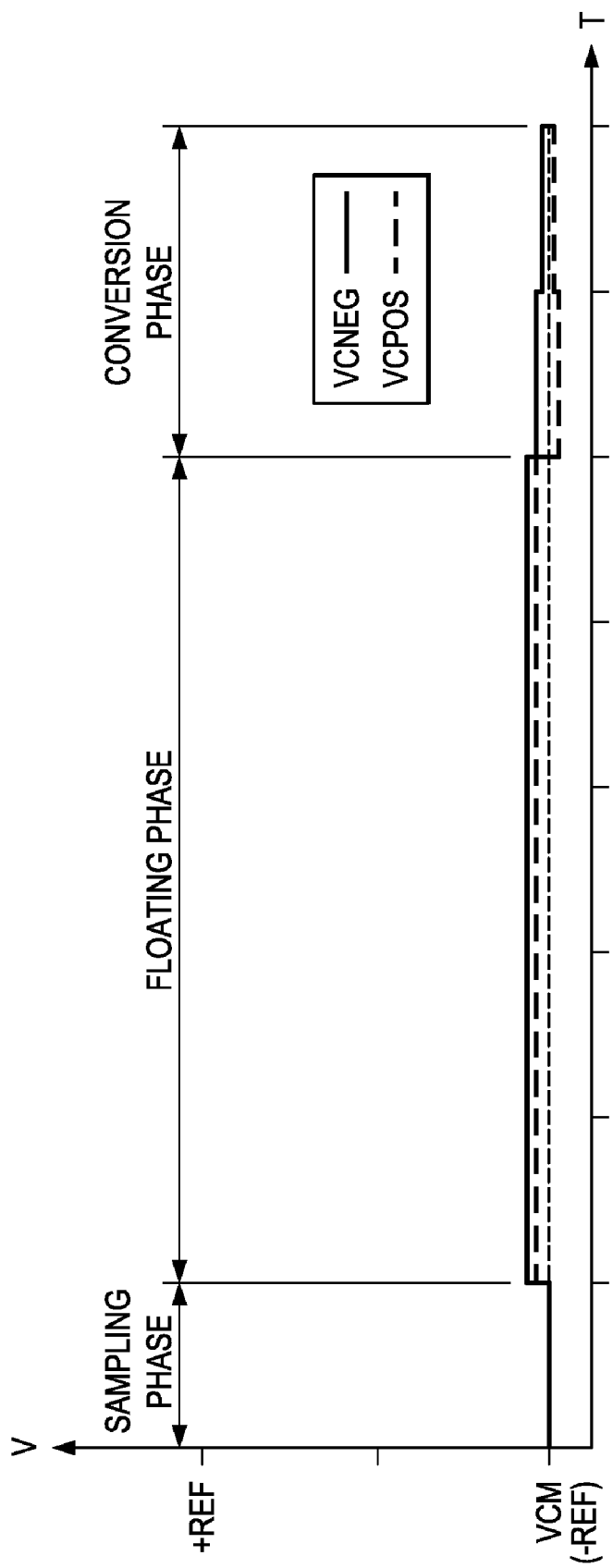
FIG. 5 is a diagram showing waveforms relating to FIG. 4.

FIG. 5 shows a diagram of waveforms relating to the voltage levels on the common nodes of a first analog-to-digital conversion stage ADC1 as shown in FIG. 4. During the sampling phase, the nodes VCPOS and VCNEG are coupled to common mode voltage level VCM. In the present embodiment, this common mode voltage level VCM is ground (in alternative embodiments, it may be another supply voltage level) in order to provide low power sampling. During the floating phase, the charge on the capacitors and the high impedance common nodes VCPOS and VCNEG is frozen and the comparator inputs of comparator CNp1 do not change. However, due to charge injection, when the input switches are opened, the voltage levels of VCPOS and VCNEG differ from VCM.

After the first bits are evaluated by the second analog-to-digital conversion stage ADC2 (as shown in FIG. 3), the floating capacitors of the first analog-to-digital conversion stage ADC1 can be switched to the appropriate reference voltage levels. Due to mismatch between reference switches and control signals, significant glitches may occur on common nodes VCPOS and VCNEG during the switching procedure. In order to prevent forward biasing of any parasitic diodes and switches and a corresponding leakage of charge on VCPOS and VCNEG, the potentials of the common nodes VCPOS and VCNEG may be shifted. A corresponding circuit is shown in FIG. 6.

Figure 6:
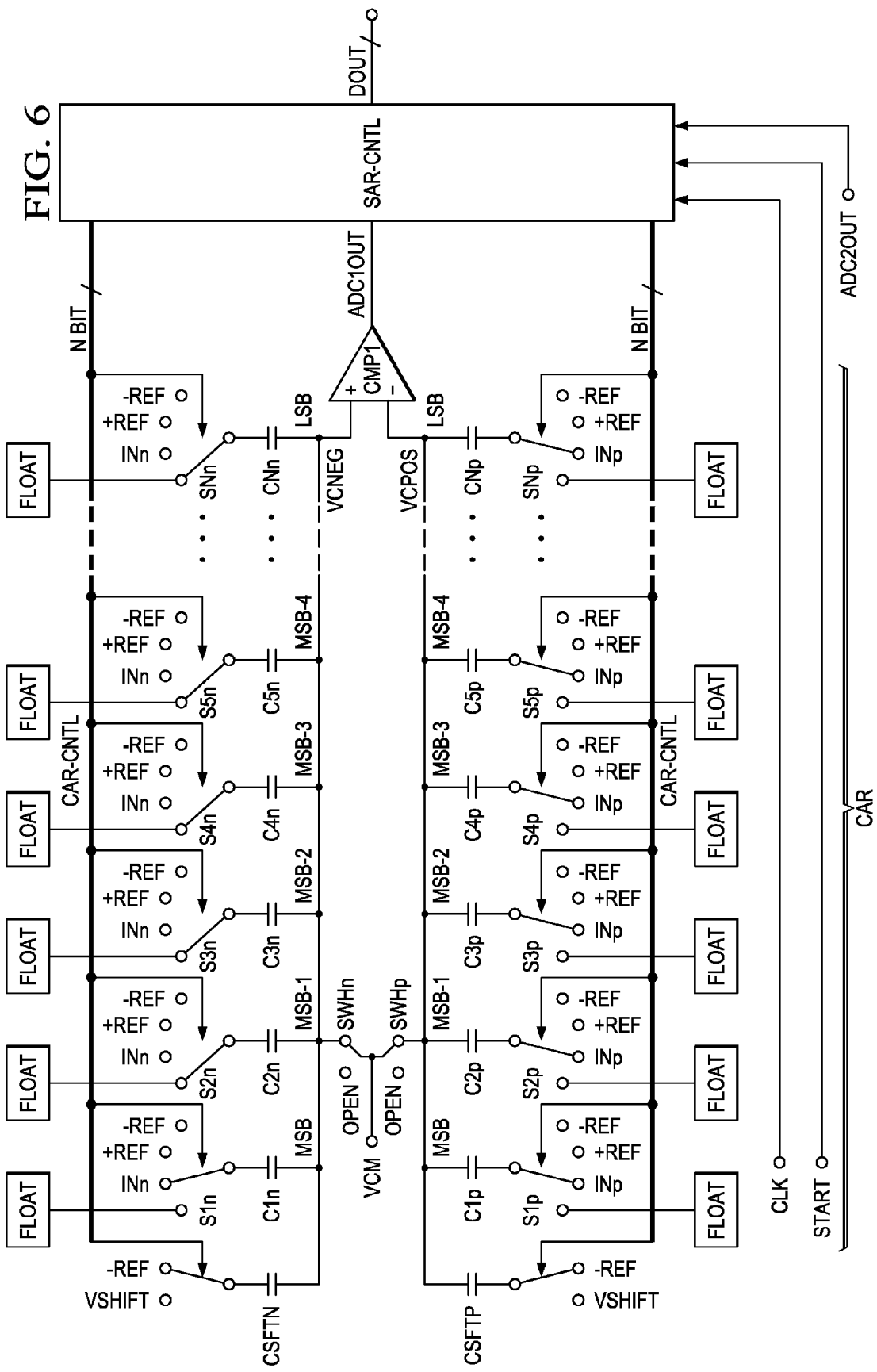
FIG. 6 is a simplified circuit diagram of a first analog-to-digital conversion stage in an apparatus according to a preferred embodiment of the present invention.

FIG. 6 shows a simplified circuit diagram of a first analog-to-digital conversion stage, which is mainly similar to the embodiment of FIG. 4. However to shifting capacitors CSFTP and CSFTN are ended in order to provide a shifting capability of the common mode voltage level. This shifting is generally necessary during the floating phase, during which the floating capacitors are connected to the respective reference voltage levels. During the floating phase, the capacitor CSFTN and CSFTP are switched from −REF to VSHIFT. The voltage level at −REF is ground and VSHIFT is the positive reference voltage level +REF. The behavior of the common nodes VCPOS and VCNEG is shown in FIG. 7.

Figure 7:
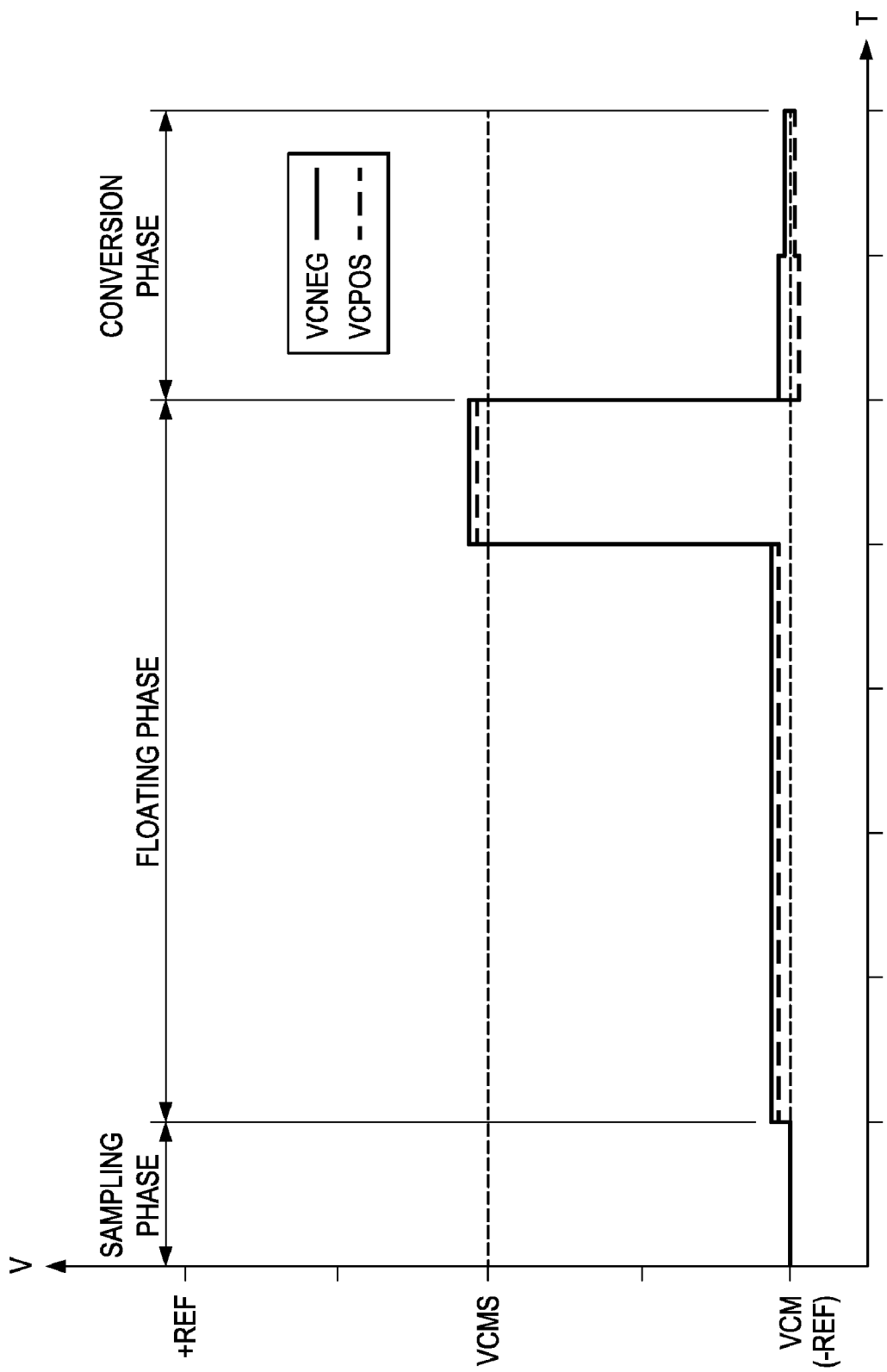
FIG. 7 is a diagram showing waveforms relating to the embodiment shown in FIG. 6.

FIG. 7 shows a diagram of waveforms relating to the common node voltage levels VCNEG and VCPOS as well as the common mode voltage level VCM of the embodiment shown in FIG. 6. The value of the common mode shift voltage VCMs is adjustable by the size of the capacitors CSFTN and CSFTP and the voltage difference between VSHIFT and −REF. The common mode shift voltage VCMS is determined as follows:

$$VCMS \approx VCM + (V_{SHIFT} - (-REF_N)) \times \frac{C_{SFT}P}{C_{SFT}P + C_{PAR}} \quad (1)$$

The capacitance CPAR is the sum of all parasitic capacitances of node VCPOS and the floating sides of the capacitors C1p-CNp. After switching of the first bits (i.e. connecting the corresponding capacitors to the respective reference voltage levels) the common mode shift voltage VCMS can be reduced, i.e. the common mode voltage level VCM can be set to ground (i.e. for example to −REF in this embodiment). The critical decisions (e.g. immediately before error correction and during subsequent conversion steps) may be performed with the same common mode voltage level as the offset compensation of the comparator CMP1 so that no additional errors are contributed.

The common mode shift may also be implemented with capacitors relating to bits which are used for conversion and not for sampling) not shown in this embodiment).

Figure 8:
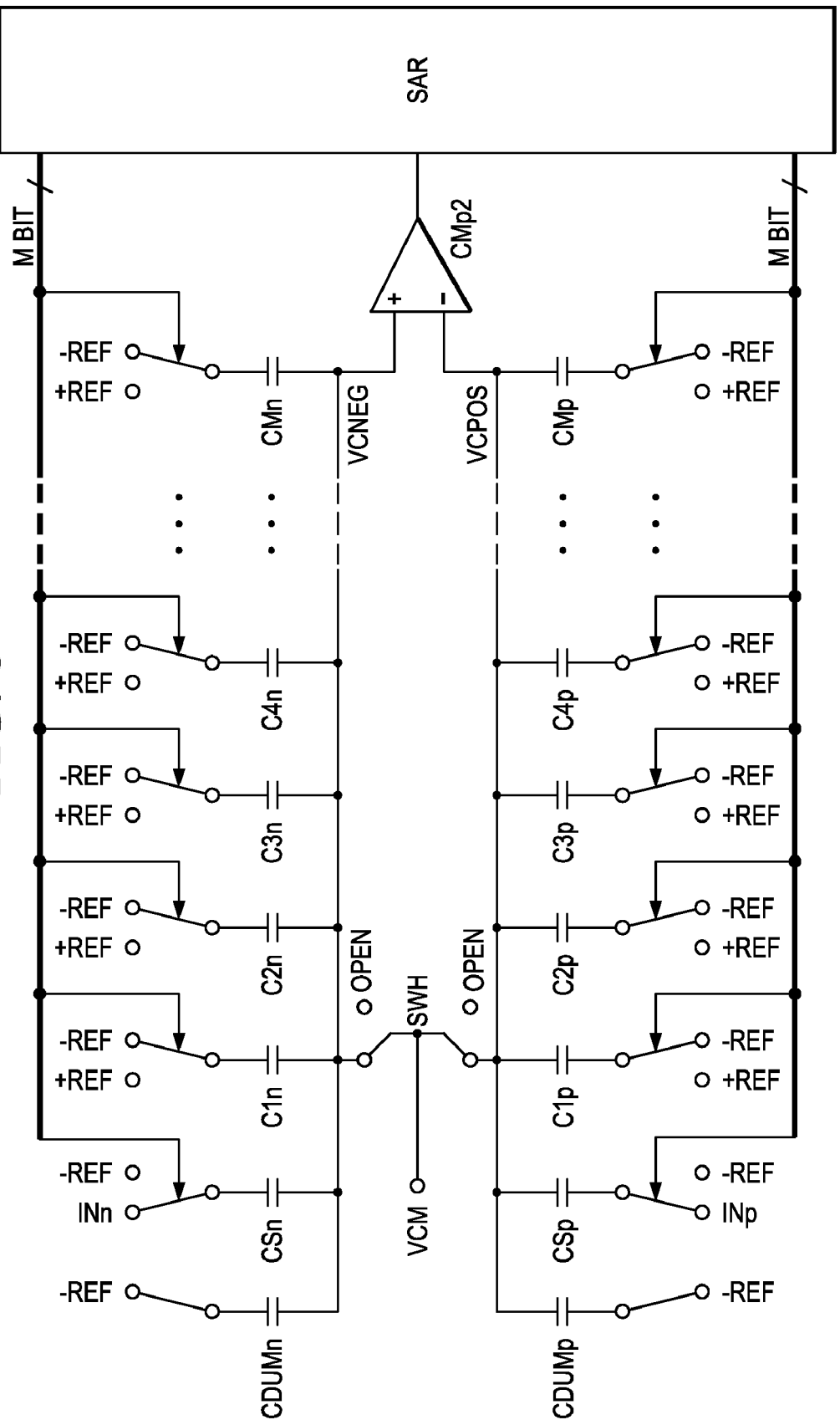
FIG. 8 is a simplified circuit diagram of a second analog-to-digital conversion stage in an apparatus according to a preferred embodiment of the present invention.

FIG. 8 shows a simplified circuit diagram of a second analog-to-digital conversion stage ADC2 according to a preferred embodiment of the present invention. This analog-to-digital converter may be implemented for example as a stand alone analog-to-digital converter or it may share components (for example the comparator CMP2) with the first analog-to-digital conversion stage ADC1. Successive approximation register converters have lower power consumption than flash converters. Therefore, it is advantageous to use an SAR ADC as the second analog-to-digital conversion stage ADC2. In order to ensure low power sampling, also the second analog-to-digital conversion stage ADC2 may use ground as the common mode voltage VCM.

The input voltage INn, INp may preferably be divided so that the maximum swing of the common nodes VCPOS and VCNEG during the first decisions made in second analog-to-digital conversion stage ADC2 are smaller than the forward bias voltage of a parasitic diode. For a 5 V single ended supply voltage, a 5 V input voltage may be divided by a factor of 16. This limits the input voltage swing to +/−156 mV. There are several possibilities for dividing the input signal, as for example a resistive or a capacitive divider etc. Advantageous embodiments use a capacitive divider.

The input voltage INn, INp is sampled on capacitors CSp and CSn and converted by use of capacitors C1p-CNp and C1n-CMn. In order to avoid gain errors, the capacitors used for sampling and conversion generally have equal sizes. During the conversion CSp and CSn are connected to −REF and +REF, respectively. For evaluating the first bits, C1n and C1p are connected to +REF. The value of VCPOS may then be calculated as follows:

$$VCPOS = VCM + \frac{(REF_P - REF_N) \times C_1 - (IN_P - REF_N) \times C_S P}{C_S P + \sum_{i=1}^{M} C_i + C_{DUM}P} \quad (2)$$

The capacitor $C_{DUM}P$ is used to adjust the swing of common node VCPOS. The value of VCNEG can be calculated in a similar way.

Figure 9:
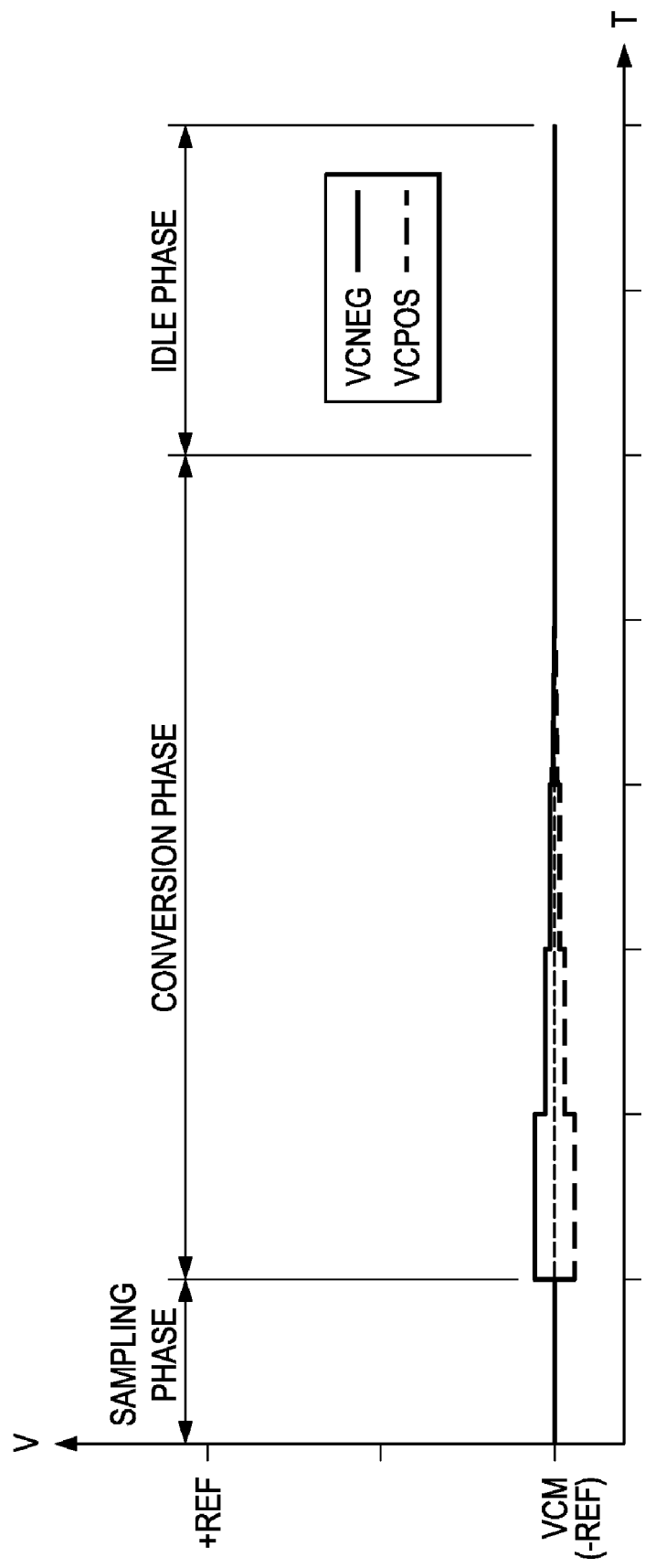
FIG. 9 is a diagram showing waveforms relating to FIG. 8.

FIG. 9 shows waveforms relating to the embodiment shown in FIG. 8. The behavior of the common nodes VCPOS and VCNEG is indicated in FIG. 9. The input voltage is divided by a factor of 16. All first decisions made by the second analog-to-digital converter of FIG. 9 during the conversion phase include an error resulting from increased noise, mismatch between capacitors and offset. The sum of these errors can also be multiplied by the factor of the division. In order to eliminate the error, a dynamic error correction step as described in U.S. Pat. No. 6,747,589 may be performed. This step is preferably performed after the floating capacitors are connected.

The input signal can be divided without using dummy capacitors if the range of reference voltage is smaller than the range of the input voltage. The disadvantage of this solution consists in different reference voltages for the first analog-to-digital conversion stage ADC1 and the second analog-to-digital conversion stage. This difference may cause a greater error during the evaluation of the first bits with the second analog-to-digital conversion stage.

Figure 10:
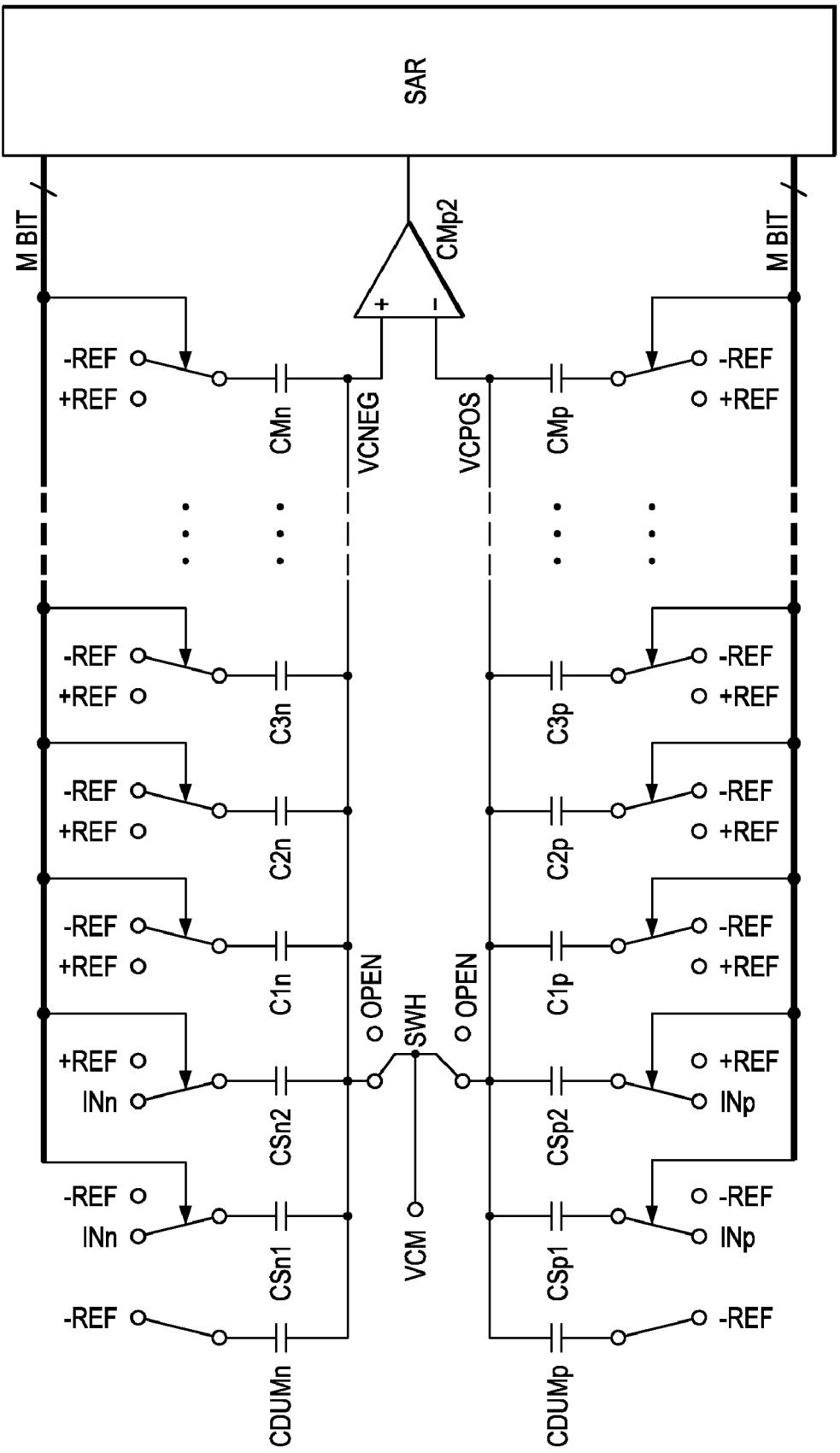
FIG. 10 is a simplified circuit diagram of a second analog-to-digital conversion stage according to a preferred embodiment of the present invention.
Figure 11:
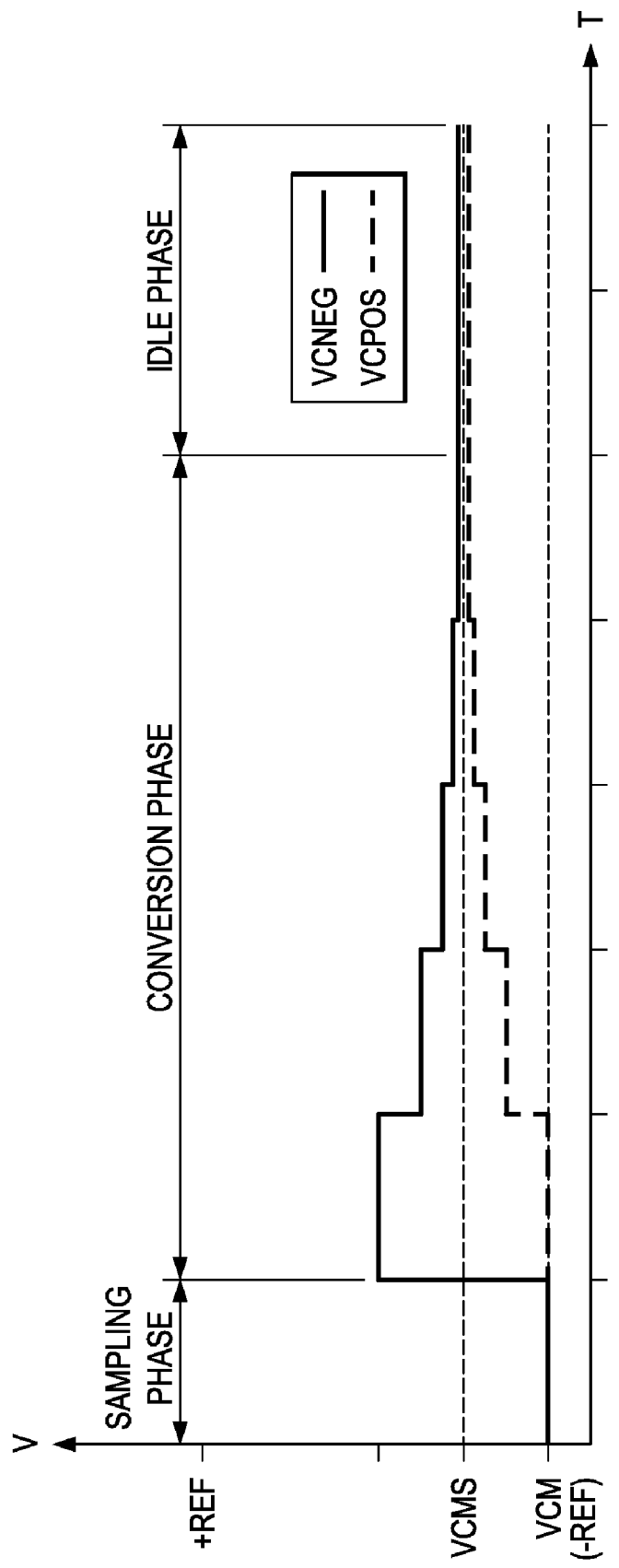
FIG. 11 is a diagram of waveforms relating to FIG. 10.

FIG. 10 shows a simplified circuit diagram of a second analog-to-digital conversion stage ADC2 according to a preferred embodiment of the present invention. This embodiment uses common mode voltage shifting. The critical decisions during the first conversion steps can be performed at a higher common mode voltage level as the one used during the sampling phase. The input voltage is sampled on sampling capacitors CSp1 and CSn1 and can be converted with capacitors C1n-CNn and C1p-CNp. The sampling and conversion capacitors generally have equal sizes, if the range of reference voltages and the input voltage range are equal. During the conversion, one part of the sampling capacitors can be connected to +REF (CS2) and the remainder to −REF (CS1). The behavior of common nodes VCPOS and VCNEG is shown in FIG. 11. The value of VCMS is:

$$VCMS = VCM + \frac{(REF_P - REF_N) \times \left(\frac{C_S 2}{2} - \frac{C_S 1}{2} + C1\right)}{C_S 1 + C_S 2 + \sum_{i=1}^{M} C_i + C_{DUM}} \quad (3)$$

The common mode shift voltage VCMS can be adjusted by use of the ratio of CS1, CS2 and the size of dynamic capacitor CDUM. The conversion phase is followed by the idle phase where VCPOS and VCNEG remain at the level of VCMS. The error resulting from the common mode shift can be corrected in the first analog-to-digital conversion stage ADC1 by use of dynamic error correction. By use of a combination of common mode shift and division of the input voltage in the second analog-to-digital conversion stage, it is possible to convert much greater signals than the allowable voltage swing on common nodes VCPOS and VCNEG without loss of signal range.

For implementing the low power sampling according to aspects of the present invention, the offset compensation of the comparator CMP1 and CMP2 is performed after the sampling phase. Because of the error correction in the first analog-to-digital conversion stage ADC1, the second analog-to-digital conversion stage ADC2 uses reduced accuracy. Therefore, offset compensation in the comparator of the second analog-to-digital conversation stage may not be used. The offset storage on the main comparator in the first analog-to-digital conversion stage ADC1 may be performed during the floating phase of the first analog-to-digital conversion stage, when the second analog-to-digital conversion stage ADC2 performs the first conversion steps. This reduces the acquisition time of the complete analog-to-digital converter including the first and the second analog-to-digital conversion stage.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus for analog-to-digital conversion using successive approximation being adapted to be supplied with a single ended supply voltage, the apparatus comprising:
   a first analog-to-digital conversion stage including:
      a first set of capacitors coupled with a side at a common node and adapted to sample an input voltage and to be coupled to one of a first reference voltage level and a second reference voltage level; and
      a floating capacitor from the first set of capacitors;
   a second analog-to-digital conversion stage; and
   a control stage being adapted to connect the floating capacitor to one of the first reference voltage level and the second reference voltage level in response to an analog-to-digital conversion decision made by the second analog-to-digital conversion stage, wherein the first analog-to-digital conversion stage is operable to couple the common node to a supply voltage level during analog-to-digital conversion.

2. The apparatus according to claim 1, wherein the control stage is adapted to perform a plurality of analog-to-digital conversion decisions with the second analog-to-digital conversion stage and to connect the floating capacitor of the first stage in response to the decisions such that after connecting the floating capacitor to one of the first and second reference voltage level, and wherein a voltage level at the common node with respect to ground is lower than a forward bias voltage of a diode.

3. The apparatus according to claim 1, wherein the second analog-to-digital conversion stage is adapted to use successive approximation, includes a second set of capacitors, and is operable to divide the input voltage before it is converted.

4. The apparatus according to claim 2, wherein the second analog-to-digital conversion stage is adapted to continue analog-to-digital conversion, while the floating capacitor from the first analog-to-digital conversion stage is coupled to the respective reference voltage.

5. The apparatus according to claim 1, wherein the apparatus further comprising a comparator coupled to the common node of the first set of capacitors.

* * * * *